United States Patent [19]

Brasch et al.

[11] Patent Number: 4,759,952
[45] Date of Patent: Jul. 26, 1988

[54] PROCESS FOR PRINTED CIRCUIT BOARD MANUFACTURE

[75] Inventors: William R. Brasch, Nesconset, N.Y.; Carlo Favini, Milan, Italy

[73] Assignee: LeaRonal, Inc., Freeport, N.Y.

[21] Appl. No.: 898,073

[22] Filed: Aug. 20, 1986

Related U.S. Application Data

[63] Continuation of Ser. No. 574,086, Jan. 26, 1984.

[51] Int. Cl.$^4$ ............................................. B05D 5/12
[52] U.S. Cl. ...................................... 427/98; 427/306
[58] Field of Search .................................... 427/97, 98

[56] References Cited

U.S. PATENT DOCUMENTS

| | | | |
|---|---|---|---|
| 2,690,402 | 9/1954 | Crehan | 427/306 |
| 2,927,022 | 3/1960 | Martin et al. | 96/35 |
| 3,469,982 | 9/1969 | Celeste | 96/35.1 |
| 3,532,518 | 10/1970 | D'Ottavio | 106/1 |
| 3,562,038 | 2/1971 | Shipley | 427/98 |
| 3,632,435 | 1/1972 | Segeltorp | 117/212 |
| 3,799,816 | 3/1974 | Schneble, Jr. et al. | 156/3 |
| 3,871,885 | 3/1975 | Hertler | 96/35.1 |
| 3,958,048 | 5/1976 | Donavan et al. | 427/304 |
| 3,993,799 | 11/1976 | Feldstein | 427/53 |
| 4,073,981 | 2/1978 | Baron | 427/259 |
| 4,087,586 | 5/1978 | Feldstein | 428/457 |
| 4,089,686 | 5/1978 | Townsend | 96/35.1 |
| 4,100,037 | 6/1978 | Baron et al. | 204/15 |
| 4,136,216 | 1/1979 | Feldstein | 427/306 |
| 4,199,623 | 4/1980 | Nuzzi et al. | 427/305 |
| 4,220,678 | 9/1980 | Feldstein | 427/305 |
| 4,233,344 | 11/1980 | Brasch | 427/304 |
| 4,259,113 | 3/1981 | Nuzzi et al. | 106/1.11 |
| 4,305,975 | 12/1981 | Ikari et al. | 427/97 |
| 4,478,883 | 10/1984 | Bupp | 427/306 |
| 4,610,910 | 9/1986 | Kawamoto | 427/98 |
| 4,634,619 | 1/1987 | Lindsay | 427/98 |

FOREIGN PATENT DOCUMENTS

| | | | |
|---|---|---|---|
| 44878 | 2/1982 | European Pat. Off. | 427/306 |
| 1814055 | 6/1970 | Fed. Rep. of Germany . | |
| 52-32829 | 3/1977 | Japan | 427/98 |
| 55-9459 | 1/1980 | Japan | 427/98 |
| 55-50690 | 4/1980 | Japan | 427/98 |
| 57-4116 | 1/1982 | Japan | 427/98 |
| 2066582 | 7/1981 | United Kingdom | 427/97 |

OTHER PUBLICATIONS

McFayden & Matijevic, Journal of Colloid and Interface Science, vol. 44, No. 1, Jul. 1975, pp. 95–106.
Weiser, Inorganic Colloid Chemistry, vol. I, John Wiley & Sons, Inc., 1933, pp. 137–138.
Encyclopedia of Chemical Technology, Kirk-Othman, 3rd Edition, vol. 17, pp. 680–708, (1982).

*Primary Examiner*—John H. Newsome
*Attorney, Agent, or Firm*—Pennie & Edmonds

[57] ABSTRACT

The method for the manufacture of printed circuit boards which have been imaged by means of a polymeric resist which comprises selectively catalyzing those areas not covered by the image by treating the imaged circuit board with a catalyst having a charge higher than the charge on the non-imaged areas and sufficiently lower than the charge on the resist image to cause the catalyst to be repelled therefrom, but sufficiently close to the charge on the non-imaged areas to cause adsorption of the catalysts thereon.

23 Claims, No Drawings

PROCESS FOR PRINTED CIRCUIT BOARD MANUFACTURE

This is a continuation of application Ser. No. 574,086, filed Jan. 26, 1984.

BACKGROUND OF THE INVENTION

This invention relates to the manufacture of printed circuit boards and more particularly to a new and novel process for manufacturing these boards. Much has been written about printed circuit board manufactures and many patents have been granted in this large and rapidly growing industry. These boards have become very important commercially, since they are used in almost every area of the electronics industry and form an important part of almost every electronic device that is made. Printed circuitry has become a most economical and viable technique for electrically connecting the various components that make up any device that utilizes electronics.

In order to make a printed circuit board, the starting material is usually a board consisting of fiberglass cloth and epoxy resin. In this form, the board is a dielectric, thus preventing short circuits from taking place between the various electronic components that are attached to the board. In place of epoxy resin, it is possible to use a phenolic resin or other suitable resins. In place of the fiberglass cloth, it is possible to use compressed paper or other suitable materials. The basic board is therefore a flat, rigid or slightly flexible, dielectric material that is suitable to be fabricated into the final printed circuit. The most common form of starting material for making these boards is a plastic sheet or board which also contains a thin layer of copper laminated to both sides of the board with suitable adhesion. This combination is commonly called copper laminate.

Holes. In most cases, holes are provided through these boards (usually by drilling) to accommodate the leads of the various electronic components that will be attached thereto. The holes are drilled using high speed drilling machines and the locations of the holes are specified in the drawings or blueprints for the boards.

Metallizing. In order to make an electrical connection from one side of the copper laminate through the holes to the other side, the plastic wall of the hole must now be made conductive. This is accomplished by a chemical process commonly known in the industry as metallization, and consists of a relatively complicated series of chemical tanks and rinses and an activating step to apply a thin copper layer to the hole walls.

Imaging. The image is a circuit design that has been applied to the surface of the drilled board in accordance with the requirements of the specifications or blueprints. The image is an organic coating applied either as a dry film (photo resist) or a screened ink. The organic coating forms the circuit design pattern by protecting only the surface onto which it is applied in order to prevent chemical attack on these surfaces during processing.

Electroplating. Since the copper layer formed by the metallizing process is generally too thin to form a suitable electrical bridge between the two copper layers of the board, copper electroplating is used to deposit a heavy layer of copper in the holes in order to form a suitable copper cross section for carrying current. Copper plating is generally followed by tin-lead or tin plating in order to supply both solderability and a surface that chemically resists the etching solution that is used in the etching step that follows.

Etching. When the organic coating that forms the image is stripped off, the thin layer or bare copper is exposed. This bare copper is now completely etched away down to the plastic leaving a board that now has an electrical circuit firmly attached to the plastic surface and drilled holes that are electrically connected and suitable for accepting the electronic components that will be mounted onto it.

PRIOR ART METHODS

In general, there are three commonly used methods for manufacturing a printed circuit board, commonly known as the subtractive method, the fully additive method and the semi-additive method.

Subtractive Method.

1. A copper laminate as described above is drilled to specifications.
2. The boards are now brought into the plating room, placed on suitable racks or plating fixtures, and metallized to produce the thin layer of copper inside the drilled holes.
3. The boards are now removed from the plating racks or fixtures and an image or circuit design is applied.
4. The boards are once again placed on suitable plating racks or fixtures and electroplated with copper followed by tin-lead.
5. The organic coating is now stripped off.
6. The boards are now etched to remove all the copper that previously had been covered by the organic resist.

The majority of plants making printed circuit boards use the subtractive method because of its ease of control when compared with the other production methods.

Fully Additive.

In the fully additive method, the starting board is different from the one described in the subtractive method since it does not contain any copper laminated to it at all. Instead the plastic is treated or impregnated with catalytic material which is necessary to initiate electroless metal or copper plating or metallization. The method is as follows:

1. Start with an adhesive coated plastic board which has been catalytically treated to initiate electroless metal deposition.
2. The boards are drilled to the required specifications.
3. The boards are imaged to produce the circuit design.
4. A heavy electroless copper deposit is now applied. This copper deposit is very thick and can readily take the place of the electrolytic copper deposit that is used in subtractive and semi-additive methods. Electroplated tin-lead coatings are not required here because etching is not necessary with the fully additive method.
5. The image or plating resist is now removed.

Semi-Additive.

The semi-additive method for making printed circuit boards begins with a plastic board that has no copper applied to it at all, but does have a layer of an adhesive on its surface. The purpose of the adhesive is to assist in obtaining the proper degree of adhesion of the electroless copper layer that is subsequently applied.

1. Begin with the adhesive coated plastic board.
2. Drill holes to the required specifications.

3. The boards are put onto plating fixtures and metallized using a thin layer of electroless copper which covers the entire plastic board as well as the drilled holes.

4. The image or circuit design is applied.

5. The boards are put onto plating racks and electroplated with a thick layer of electrolytic copper followed by tin-lead as with the subtractive method.

6. The organic image is removed.

7. The very thin flash of electroless copper covered by the image is etched away.

Metallizing.

In these methods for making printed circuit boards by the subtractive and semi-additive processes, there are two separate lines of chemical treating and rinsing tanks required—namely, the metallization line and the electroplating line. These two lines of tanks are different from each other; they are separated in different parts of the plating room, and the plating racks and fixtures used in each line are also different. A typical metallization line would have the following tanks.

1. Alakaline clean.
2. Double rinse.
3. Microetch.
4. Rinse.
5. Pre-dip (usually an acid)
6. Catalyst.
7. Rinse.
8. Accelerator.
9. Rinse.
10. Electroless copper.
11. Double rinse.
12. Dry.

The catalyst can be the commercial palladium-tin colloid. The accelerator is used to remove the tin from the catalyzed surface to permit better electroless copper deposition as is well known in the art.

The electroless copper film thickness must be heavy enough to remain intact during the handling and treating sequence that follows. It must be thick enough to withstand the operations required for the application of the resist and also all the chemical treating that is necessary for the electroplating line that follows. These thicknesses are generally in the order of 50–100 microinches. In some cases, a thinner electroless copper of about 20–30 microinches is applied and then reinforced by a thin layer of electrodeposited copper of about 100 microinches. This copper layer coats the entire board in both the subtractive and semi-additive method of making boards, and most of it gets etched away in the etching step, since the metallization is only required in the drilled holes. Thus, we see that most of the electroless copper used on the printed circuit board is actually wasted and is therefore very costly.

Electroplating.

After imaging, the boards are brought back into the plating room for electroplating. A typical plating sequence is as follows:

1. The boards are placed on plating fixtures or racks.
2. Clean in an acid cleaner.
3. Double rinse.
4. Microetch.
5. Rinse.
6. Acid dip.
7. Rinse.
8. Copper plate to the required thickness.
9. Double rinse.
10. Acid dip
11. Rinse
12. Tin-lead plate
13. Double rinse.
14. Dry.

OBJECTIVE OF THE INVENTION

The objectives of this invention include the following:

1. Simplify the method of making printed circuit boards.
2. Reduce the electroless copper thickness required in the holes.
3. Confine the electroless copper only to the holes and/or pads where required.
4. Reduce the amount of equipment required during manufacture.
5. Reduce the amount of floor space required for metallizing and plating.
6. Increase production.
7. Reduce costs.

Other advantages that will become apparent to those skilled in the industry.

DESCRIPTION OF THE INVENTION

These objectives have been realized with the discovery of the new process herein disclosed for making printed cicuit boards in which the electroless plating sequence and the electrolytic sequence are combined into one plating line. Only one operation for racking the boards on plating fixtures is required, since now there is only one plating line rather than the two lines described in the prior art methods. The new process is made feasible by the discovery that it is possible to catalyze the drilled holes of the printed circuit board selectively without, at the same time, catalyzing the organic resist film that forms the image or circuit design. Because of this selective catalyzation, it is now possible to metallize only the circuit pads and through holes without any metallization forming on the organic film or resist. Because of the selective metallization, and the new method for making boards will have the following sequence when using the subtractive method.

1. A copper laminate, as in the prior art, is drilled to specifications.
2. Apply the image to produce the circuit design.
3. The boards are now placed on plating fixtures, cleaned, selectively catalyzed and electroless copper plated only in the drilled holes and circuit pads without any metallization taking place on the resist image. Only a relatively thin copper layer is required in this step compared with prior art methods, since all that is required of the copper layer in this invention is electrical continuity between the two surfaces of the board.
4. After rinsing, the boards are now copper plated with electrolytic copper followed by tin-lead plating.
5. The plating resist is removed.
6. The boards are etched to remove the copper that was under the plating resist thus forming the completed circuit.

In the fully additive method, it would now be possible to eliminate the boards impregnated with catalytic material required for the prior art method, and instead it would be possible to start with an adhesive coated plastic board similar to that used for the semi-additive method. With the fully additive method, the prior art required one plating line as with the inventive method; however, a considerable savings would be realized, since it is now possible to start with a simple board rather than the prior art board that required impregnated catalytic material.

Selective Metallization.

Selective metallization has been achieved in the prior art and U.S. Pat. No. 3,632,435 describes such a method based on different surface characteristics of rough and smooth areas on the surface. According to the patent, this method relies on the ability of the rough surface to retain catalytic material whereas the smooth surface does not. Reactive strippers are used to further develop the selectivity of the catalyzation with this method.

U.S. Pat. No. 4,073,981 discloses a method of selective metallization through the use of a copolymer of maleic anhydride and a vinyl monomer to delineate a surface pattern to which colloidal particles will not adhere. Using this method, the copolymer coating forms the basis of the selectivity and no distinction is made in the disclosure between the different colloids that can be used.

The same patent and U.S. Pat. No. 4,100,037 issuing on application Ser. No. 664,610 referred to therein also disclose prior art attempts at selectivity using a colloidophobic material which repels or does not retain a colloidal species. This method, as well as the previous methods, does not differentiate between available activating colloids and only relies on the repelling nature of the colloidophobic material.

U.S. Pat. No. 4,089,686 discloses treating a developed circuit board with noble metal ions and then reducing the metal ions to render the noble metal catalytic. In column 5 the patent also notes that the developed board cannot be treated with a reducing agent first and then a noble metal ion, nor can colloids, the one-step activator disclosed in U.S. Pat. No. 3,532,578, be used without causing plating on the insolubilized resist.

In spite of these prior art disclosures, selective metallization with its accompanying benefits is still not used and sold commercially. The present invention resides in the discovery that it is possible to metallize selectively through the use of certain colloidal catalysts and to activate and metallize the circuit board after resist imaging which results in the many advantages referred to above.

The boards can be imaged using commonly used dry film photoresists or commercially available screened inks. Selectivity can be achieved with the present invention through the use of those active colloids that are weakly charged (low Zeta Potential). The charge must be such that the colloidal particles will be repelled electrically by the material in the image due to its own high electrical charge, while at the same time being attracted to the plastic of the printed circuit board which has an electrical charge that is lower or opposite to that of the colloid.

Methods for making active colloids and their use for metallizing plastics are in the prior art. The following U.S. Patents issued to Feldstein disclose non-precious metal catalysts: U.S. Pat. Nos. 3,993,799, 4,087,586, 4,220,678 and 4,136,216. Also typical of non-precious metal catalysts are U.S. Pats. Nos. 4,199,623 and 4,259,113 issued to Nuzzi and U.S. Pat. No. 3,958,048 issued to Donovan. Precious metal catalyst, both colloidal and in ionic solutions, are also well known in the art.

The following literature references are just a few describing methods for producing non-precious metal colloidal dispersions which can be suitable or can be made to be suitable as catalysts for metallization.

1. Peter McFayden & Egon Matijevic, JOURNAL OF COLLOID and Interface Service, 44 (1973).
2. Weiser INORGANIC COLLOID CHEMISTRY, a textbook.

The above patents and literature references are incorporated herein by reference to indicate the innumerable methods for producing both precious and non-precious metal catalysts for catalyzing plastic surfaces for subsequent metallization. Only some of these many catalysts are suitable for selective catalization according to this invention. The most successful ones have a low negative (or positive) Zeta Potential between about −3 and −20 or +3 and +20 millivolts. Since plastic surfaces have a charge of zero or close to it, and many dry film photoresists can have a higher negative charge than that of the catalyst, selective catalization can take place using commercially available resists. The use of low negative colloids are most advantageous, since most commercially used photoresists have a fairly high negative charge. The U.S. Pat. No. 4,220,678 to Feldstein is one example in the prior art showing how the charges of metallization colloids can be altered to come within the useful ranges as disclosed herein.

Various photosensitive polymeric resists can be used according to this invention including fully aqueous, semi-aqueous (sometimes referred to as semi-aqueous dry films) and solvent dry film types to achieve the selectivity. These photosensitive polymeric resists are well known in the art and are discussed in some detail in the ENCYCLOPEDIA OF CHEMICAL TECHNOLOGY by Kirk-Othmer, 3rd Edition, Vol 17, pages 680–708 (1982).

Examples of semi-aqueous dry film and solvent dry film resist are disclosed in U.S. Pat. Nos. 2,927,022, 3,469,982 and 3,871,885. All of the above publications are incororated herein by reference. The polymeric photosensitive resists can be rendered negative prior to application of the resist to the circuit board surface or the resists may be negative after insolubilization as marketed. It is preferable to treat the resist after imaging with a charge extender to render it negative or positive, or more negative or positive, as the case may be, to prevent any possible interference with the operation of the resist, namely insolubilization by exposure to light and washing out the insolubilized areas. The particular resist used must also remain insoluble throughout the remaining steps of the process, such as the electroless and electrolytic copper deposition baths. For example, the use of some aqueous and polymeric resists tend to dissolve in high pH electroless plating baths; in which case these types of resists should either be avoided or the pH or the electroless copper bath reduced sufficiently to prevent injury or dissolving of the insolubilized resist. The semi-aqueous dry film type resists, such as DuPont RISTON, Series 215R used in the examples, has so far proved to be most advantageous for practicing the invention. RISTON resists are acrylate based resists as described in U.S. Pat. No. 3,469,982.

The degree of selectivity is closely associated with the electrical charges of (a) the colloidal particles (b) the plastic of the circuit board, and (c) the organic resist film that comprises the image. The charge of the catalyst particles should be in between the charges of the plastic in the board and the organic resist image, for example, less negative than the image material and more negative than the board.

Charge Extenders

It is known to those skilled in the art that it is possible to change surface charges of organic and plastic surfaces in the negative direction by treating with anionic wetting agents where the negatively charged anion will be absorbed on the organic or plastic surface.

Typical of these are fatty acid sulfates (such as sodium lauryl sulfate) and alkyl aryl sulfonates (such as sodium lauryl benzene sulfonate). It is also known that treating organic and plastic surfaces with strong oxydizing agents will create or increase the negative charge of those surface. Typical oxydizing agents capable of accomplishing this are sulfuric acid, chromic acid, potassuim permanganate and hydrogen peroxide. Treating organic and plastic surfaces with strong alkalis, such as sodium hydroxide, can also create or increase their negative charges. We will call these materials "charge extenders". The amount of change in charge of any given organic or plastic surface depends on the chemical makeup of the material and how it reacts with any particular charge extender from the above groups. Since the chemical composition of the image differs from that of the plastic of the board, the degree of change in surface charge with any given treatment will be different for each of these two surfaces. Thus, it would be possible to use the chemical treatments to enhance the electrical charges of the critical surfaces to achieve better selectivity of catalyzation.

Since the charge on the catalyst is preferably low negative, the charge on the image should preferably be high negative, and the charge on the plastic in the board should preferably be lower than the charge of the catalyst. It can be seen that many possibilities exist to adjust these charges to give the desired selectivity. The present invention teaches that it is possible to do this by either one or more of the following:

1. Choose a catalyst which has a low negative charge between −3 and −20 mv.
2. Test for selectivity of catalyst adsorption in the drilled holes and on the image.
3. If greater selectivity is required, treat the board with a charge extender.
4. If not sufficiently selective, choose another charge extender and repeat until selectivity is satisfactory.

It is also within the scope of the teachings in this invention to use a low positively charged catalyst between about +3 and +20 mv. When using such a catalyst, the image surface must become strongly positive and the plastic of the board must be either less positive than the catalyst or zero or low negative. The catalyst particles, now positive in this example, will be repelled by the highly positive image surface and be attracted to the lower charged plastic surface of the drilled hole thereby also achieving selectivity. The charge extenders used must impart positive charges on organic and plastic surfaces. Quaternary nitrogen containing surface active agents are suitable for this purpose as are other known cationic surface active agents.

The invention includes the selective metallization of plastic printed circuit boards having holes drilled therein by imaging the board with a hydrophobic resist, placing a reducing agent on the board, and treating the board with an aqueous ionic metal solution capable of being with an aqueous ionic metal solution capable of being reduced by the reducing agent on the board to a valance state which will catalyze the surfaces for electroless metal deposition and the electrolessly plating a metal thereon. In this case the hydrophilic ionic solution is repelled by the hydrophobic imaged area, but permitted to coat or be attached to the hydrophilic areas of the board, such as the plastic (e.g., spoxy-glass) areas including the plastic areas exposed by the drilled holes.

The term plastic printed circuit board as used herein includes the copper clad boards and those having an adhesive layer theron as described above.

EXAMPLE 1

A copper laminate was drilled and imaged with DuPont RISTON, Series 215R semi-aqueous photo-resist using methods well known in the art. The board was then racked for plating, cleaned in the normal manner well known in the art, then immersed for 5 minutes at room temperature in a copper colloid whose zeta potential was −12, prepared with the following:

| | |
|---|---|
| Copper Sulfate | 20 g/l |
| Sodium Citrate | 30 g/l |
| Gelatin | 3 g/l |
| Dimethyl Amino Borane | 5 g/l |

After rinsing, the board was immersed in the following electroless copper bath for 5 minutes at 38° C.:

| | |
|---|---|
| Copper Sulfate | 12 g/l |
| Quadrol | 17 ml/l |
| Rochelle Salts | 5 g/l |
| Sodium hydroxide | 20 g/l |
| Formaldehyde (37%) | 25 ml/l |
| Sodium Cyanide | 0.004 g/l |

It was observed that an electroless copper film covered the holes as well as all areas not covered by the RISTON coating with substantially no copper coverage on the RISTON film. After thorough rinsing, the boards were then electroplated with copper to achieve 1 mil of copper in the holes followed by electroplating with solder to achieve 0.4 mil.

This board was thus first imaged, then plated with electroless copper followed by electroplated copper and solder in one operation, without drying after electroless copper and then imaging as in the prior art.

EXAMPLE 2

Example 1 was repeated except a charge extender was used to enhance selectivity. Prior to the cleaning step in Example 1, the board was first immersed in 25% hydrogen peroxide (50% strength) for 5 minutes at room temperature. All steps in Example 1 were then repeated. Selectivity was enhanced so that in this example there was virtually no immersion copper on the RISTON film.

EXAMPLE 3

Example 1 was repeated except that a palladium catalyst was used in place of the copper catalyst. After cleaning in the normal manner, the board was first immersed in a reducing agent comprising dimethyl amino borane - 0.25 g/l for 5 minutes at room temperature followed by thorough rinsing. The board was then immersed for 5 minutes at room temperature in the palladium catalyst comprising an aqueous ionic solution containing 2.5 ppm palladium metal as palladium ammonium chloride. After thorough rinsing, the board was immersed in the electroless copper bath as in Example 1, followed by electroplating as in Example 1. This board also showed selectivity with plating taking place in all areas not covered by the RISTON and substantially no plating taking place on the RISTON film.

EXAMPLE 4

Example 1 was repeated except that a charge extender was used to enhance selectivity. In the normal cycle used to prepare the boards for metallizing, a mild etching solution is used prior to the catalyst step. This etching solution contains 10% by volume sulfuric acid, 5% of 30% hydrogen peroxide and a stabilizer. In this example, 0.1 g/l sodium lauryl sulfate is added to the etching solution and all other steps in Example 1 were repeated. Selectivity was enhanced so that there was virtually no immersion copper on the RISTON film.

We claim:

1. A method for the manufacture of printed circuit boards which have been imaged by means of a polymeric resist which comprises selectively catalyzing those areas not covered by the image by treating the imaged circuit board with a catalyst having a charge higher than the charge on the non-imaged areas and sufficiently lower than the charge on the resist image to cause the catalyst to be repelled therefrom, but sufficiently close to the charge on the non-imaged areas to cause adsorption of the catalysts thereon; wherein the selectivity of the catalyst is enhanced by treating the circuit boards with a charge extender to create a higher differential of charge between the resist image and the non-imaged areas.

2. The method of claim 1 in which the catalyst comprises colloidal particles.

3. The method of claim 2 in which the colloidal particles have a zeta potential between about 3 and 20 (plus or minus) millivolts.

4. The method of claim 2 in which the charges on the resist and of the catalyst particles are negative.

5. The method of claim 4 wherein the selectivity of the catalyst is enhanced by treating the circuit board with an anionic material to create a higher differential of negative charges between the resist image and non-imaged areas.

6. A method for metallizing a plastic printed circuit board having holes of the desired design exposing the plastic areas therein by way of the hole walls which comprises imaging the board to form the desired circuit with a resist, treating the board with a metallization catalyst that is attracted to the plastic to coat the plastic portions of the board with a catalyst and is repelled by the resist image, and electrolessly plating the treated circuit board with a metal whereby the metal is only plated on the catalyst coated areas and not on the resist image; wherein the selectivity of the catalyst is enhanced by treating the circuit boards with a charge extender to create a higher differential of charge between the resist image and the non-imaged areas so that complete selectivity of electroless plating is achieved in the absence of any etching or stripping steps only on the catalyzed plastic portions of the board and not on the resist image.

7. The method of claim 6 wherein the catalyst comprises metal ions.

8. The method of claim 7 wherein the metal ions are reduced with a reducing agent.

9. The method of claim 7 wherein the charge extender is an oxidizing agent, an alkali or acid compound, or a surfactant compound that alters the surface charge.

10. A method for the manufacture of printed circuit boards which comprises:
    imaging a plastic circuit board with a polymeric resist material;
    selectively catalyzing those areas of the board which are not covered by the resist by treating the imaged circuit board with a catalyst having a charge higher than the charge on the non-imaged areas and sufficiently lower than the charge on the resist image; and
    enhancing the selectivity of the catalyst by treating the circuit board with a charge extender to create a higher differential of charge between the resist image and the non-imaged areas so that the catalyst is repelled from the resist image and adsorbed upon the non-imaged areas.

11. The method of claim 10 wherein the catalyst comprises colloidal particles having a zeta potential of between about 3 and 20 (plus or minus) millivolts.

12. The method of claim 10 wherein the charge extender is an oxidizing agent, an alkali or acid compound, or a surfactant compound that alters the surface charge.

13. In the manufacture of plastic printed circuit boards which contain a thin layer of copper laminated to both sides and wherein an image or circuit design is produced by the application of an organic resist film, a method for selectively metallizing the plastic portions of the boards without metallizing the organic film or resist which comprises selectively catalyzing the areas on the circuit board which are not covered by the image or resist by treating the imaged circuit board with a catalyst of colloidal particles having a zeta potential between about $-3$ and $-20$ or about $+3$ and $+20$ millivolts; wherein the selectivity of the colloidal particles is enhanced by treating the circuit boards with a charge extender to create a higher differential of charge between the resist image and non-imaged areas.

14. The method of claim 13 wherein the colloidal particles are negatively charged.

15. The method of claim 13 wherein the charge extender is an oxidizing agent, an alkali or acid compound, or a surfactant compound that alters the surface charge.

16. A method for the manufacture of printed circuit boards from copper laminates having a dielectric material which contains a layer of copper laminated on each side which comprises:
    (a) drilling the copper laminate to the desired specifications;
    (b) applying an image or organic resist film to the copper layers to produce the desired circuit design;
    (c) enhancing the selectivity of the colloidal particles by treating the circuit boards with a charge extender to create a higher differential of charge between the resist image and non-images areas to facilitate selective catalyzation of the non-imaged areas;
    (d) immersing the imaged copper laminate into a solution of colloidal particles having a zeta potential between about $-3$ and $-20$ or about $+3$ and $+20$ millivolts to selectively catalyze the non-imaged areas;
    (e) plating the catalyzed areas with electroless copper so that complete selectivity of electroless plating is achieved in the absence of any etching, or stripping steps only on the catalyzed non-imaged areas and not on the resist image;
    (f) electroplating the boards with copper followed by a tin or tin/lead deposit;

(g) removing the image or organic resist film; and (h) etching the boards to remove the copper that was deposited under the image or plating resist to form the completed circuit of the circuit board.

17. The method of claim 16 wherein the charge extender is an oxidizing agent, an alkali or acid compound, or a surfactant compound that alters the surface charge.

18. The method of claim 16 wherein the colloidal particles are negatively charged.

19. The method of claim 18 wherein the selectivity of the catalyst is enhanced by treating the circuit board with an anionic material to create a higher differential of negative charges between the resist image and non-imaged areas.

20. A method for the manufacture of printed circuit boards which comprises:

(a) adhesively coating a dielectric material having the desired dimensions of a printed circuit board;

(b) drilling the dielectric material to the desired specifications;

(c) applying an image or organic photoresist film to the boards to develop the desired circuit design;

(d) enhancing the selectivity of the colloidal particles by treating the circuit boards with a charge extender to create a high differential of charge between the resist image and non-imaged areas to facilitate selective catalyzation of the non-imaged areas;

(e) selectively catalyzing the dielectric material by immersion of the boards in a solution of colloidal particles having a zeta potential between about $-3$ and $-20$ or about $+3$ and $+20$ millivolts; and (f) plating the catalyzed dielectric material with a layer of copper to obtain a printed circuit board whereby complete selectivity of electroless plating is achieved in the absence of any etching or stripping steps only on the catalyzed areas of dielectric material and not on the resist image.

21. The method of claim 20 wherein the charge extender is an oxidizing agent, an alkali or acid compound, or a surfactant compound that alters the surface charge.

22. The method of claim 20 wherein the colloidal particles are negatively charged.

23. The method of claim 22 wherein the selectivity of the catalyst is enhanced by treating the circuit board with an anionic material to create a higher differential of negative charges between the resist image and non-imaged areas.

* * * * *